United States Patent
Rapadas

(10) Patent No.: US 10,247,577 B2
(45) Date of Patent: Apr. 2, 2019

(54) WIRELESS REMOTE SENSING POWER METER

(71) Applicant: DaisyRS, Inc., San Jose, CA (US)

(72) Inventor: Jeffrey Rapadas, Hayward, CA (US)

(73) Assignee: DaisyRS, INC., San Jose, CA (US)

( * ) Notice: Subject to any disclaimer, the term of this patent is extended or adjusted under 35 U.S.C. 154(b) by 30 days.

(21) Appl. No.: 15/488,804

(22) Filed: Apr. 17, 2017

(65) Prior Publication Data

US 2017/0219379 A1 Aug. 3, 2017

Related U.S. Application Data

(63) Continuation-in-part of application No. 15/137,482, filed on Apr. 25, 2016, which is a continuation of application No. 13/310,000, filed on Dec. 2, 2011, now Pat. No. 9,347,796.

(51) Int. Cl.
*G01R 15/00* (2006.01)
*G01D 4/00* (2006.01)
*G01R 21/10* (2006.01)
*G01R 21/14* (2006.01)

(52) U.S. Cl.
CPC .............. *G01D 4/006* (2013.01); *G01D 4/002* (2013.01); *G01R 15/00* (2013.01); *G01R 21/10* (2013.01); *G01R 21/14* (2013.01); *Y02B 90/241* (2013.01); *Y02B 90/243* (2013.01); *Y04S 20/32* (2013.01); *Y04S 20/325* (2013.01)

(58) Field of Classification Search
CPC ................ G01N 22/00; G01N 24/008; G01N 2203/0641; G01R 31/2822; G01R 33/323; G01R 1/0458; G01R 1/06705; G01R 15/002; G01R 15/12; G01R 19/17; G01R 23/155; G01R 29/033; G01R 31/2872; G01R 31/2881; G01R 31/2887; H05H 1/46; Y10S 427/104
See application file for complete search history.

(56) References Cited

U.S. PATENT DOCUMENTS

| | | | |
|---|---|---|---|
| 4,977,371 A | 12/1990 | Oliver, Jr. | 324/73.1 |
| 2001/0050902 A1 | 12/2001 | Asanuma | 370/248 |
| 2008/0084199 A1 | 4/2008 | Hawkins et al. | 324/74 |
| 2011/0301905 A1* | 12/2011 | Gregg | G01R 35/005 702/106 |

(Continued)

*Primary Examiner* — Tung X Nguyen
(74) *Attorney, Agent, or Firm* — Christopher P. Maiorana, PC

(57) ABSTRACT

A remote radio frequency (RF) power sensing unit includes a first module and a second module. The first module may be configured to generate an analog signal representative of a power level of a radio frequency (RF) signal. The second module may be configured to (i) receive a particular frequency of a plurality of frequencies over a wireless communication channel from a device, (ii) generate a value conveying a magnitude of said power level of said RF signal in response to said analog signal, (iii) convert said value into a digital signal communicating said power level based on said particular frequency indexed into a table, and (iv) transmit said digital signal communicating said power level and information identifying said radio frequency power sensing unit over said wireless communication channel to said device.

20 Claims, 14 Drawing Sheets

(56) References Cited

U.S. PATENT DOCUMENTS

2012/0287792 A1* 11/2012 Nickel .............. G01R 1/06772
370/241
2012/0319697 A1* 12/2012 Gregg ................ G01R 31/2822
324/511

* cited by examiner

WIRELESS REMOTE SENSING POWER METER

CROSS-REFERENCE TO RELATED APPLICATIONS

This application relates to U.S. Ser. No. 15/137,482, filed Apr. 25, 2016, and U.S. Ser. No. 13/310,000, filed Dec. 2, 2011, now U.S. Pat. No. 9,347,796, issued May 25, 2016, each of which are incorporated by reference in their entirety.

FIELD OF THE INVENTION

The invention relates to the test and measurement field generally and, more particularly, to a method and/or architecture for a wireless remote sensing power meter.

BACKGROUND OF THE INVENTION

Power meters are used by maintenance engineers employed by major telecommunications companies. The current instrumentation market is mainly populated by stationary power meters designed for laboratory countertops, as well as portable power meters that tend to be rather large and bulky. Neither of these options proves to be convenient or practical for outdoor use by installation and maintenance engineers.

It would be desirable to implement a system that allows remote placement of monitors for measurement of power using a handheld device and that matches the level of accuracy of a countertop meter, but without being physically connected to the monitor.

SUMMARY OF THE INVENTION

The invention concerns a remote radio frequency (RF) power sensing unit including a first module and a second module. The first module may be configured to generate an analog signal representative of a power level of a radio frequency (RF) signal. The second module may be configured to (i) receive a particular frequency of a plurality of frequencies over a wireless communication channel from a device, (ii) generate a value conveying a magnitude of said power level of said RF signal in response to said analog signal, (iii) convert said value into a digital signal communicating said power level based on said particular frequency indexed into a table, and (iv) transmit said digital signal communicating said power level and information identifying said radio frequency power sensing unit over said wireless communication channel to said device.

The objects, features and advantages of the invention include providing a wireless remote sensing power meter that may (i) allow remotely monitoring devices wirelessly, (ii) allow remotely controlling devices wirelessly, (iii) include GPS capability, (iv) allow taking measurements from multiple locations, (v) be easily updated as needed, (vi) allow monitoring of distribution networks from a single (or central) location, and/or (vii) provide separate sensor and reader units.

BRIEF DESCRIPTION OF THE DRAWINGS

These and other objects, features and advantages of the invention will be apparent from the following detailed description and the appended claims and drawings in which:

DETAILED DESCRIPTION OF THE PREFERRED EMBODIMENTS

Figure 1:
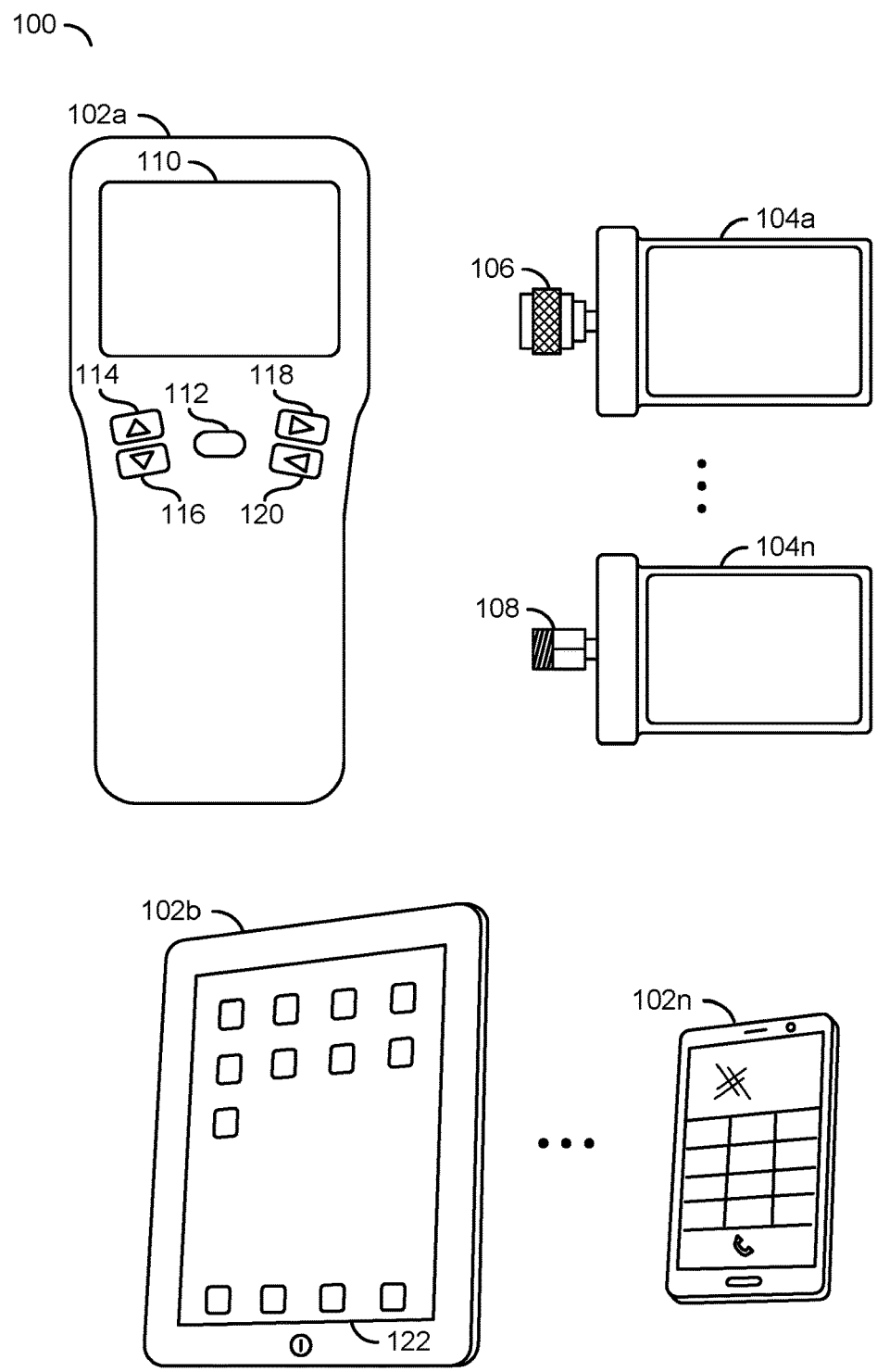
FIG. 1 is a diagram illustrating an example of a system in accordance with an example embodiment of the invention.

Referring to FIG. 1, a diagram is shown illustrating a system 100 in accordance with a preferred embodiment of the present invention. In one example, the system 100 may include a portable power meter comprising handheld reader and remote sensor units that use wireless technology to transmit measurement data from one unit to the other. Instead of building a read-out display into a main power head which contributes to the bulk of conventional portable power meters, the power meter, in accordance with an embodiment of the present invention, is split up into the remote sensor (or power head) unit and the handheld reader (or display) unit that communicate using a wireless protocol (e.g., Bluetooth®, WLAN, ZigBee®, etc.). Both components may be stored in and kept constantly charged by a carrying case that contains an internal rechargeable battery (described below in connection with FIG. 12). The power meter implemented in accordance with an embodiment of the present invention may achieve the same level of accuracy of conventional countertop models. The accuracy and portability of the system 100 generally guarantee ease-of-use, for example, in a laboratory setting or atop a radio tower.

In one example, the system 100 may comprise one or more handheld units 102a-102n and one or more remote sensor units (or monitors) 104a-104n. In one example, a handheld unit 102a may be implemented as a dedicated reader. In another example, handheld units 102b, ..., 102n may be implemented as a personal computing device (e.g., cellular telephone, smart phone, tablet, PDA, etc.) configured through software (e.g., an application program or "APP") to perform as a reader. In an example, the handheld units 102a-102n may include, but are not limited to Android® and/or iPhone® devices.

In one example, the remote sensor units 104a-104n may be configured for connection to various types of communication equipment. For example, one or more of the remote sensor units 104a-104n may be implemented with a type "N" male adapter 106. In another example, one or more of the remote sensor units 104a-104n may be implemented with a type SMA female adapter 108. However, any other appropriate adapters for connecting to a particular system to be monitored may be implemented accordingly to meet the design criteria of a particular implementation. The remote sensor units 104a-104n are generally implemented as self-contained, calibrated sensor/processor/wireless transceiver modules.

In one example, the handheld unit 102a may comprise a display 110 and a number of controls (e.g., switches, buttons, etc.) 112-120. In one example, the control 112 may be centered beneath the display 110. In one example, the control 112 may be configured as a power button. In another example, the control 112 may be configured to initiate a read operation. However, other functions may be implemented to meet the design criteria of a particular implementation. The controls 114 and 116 may be placed adjacent to one another and configured to provide complementary actions (e.g., scroll up, scroll down, etc.). The controls 118 and 120 may also be located adjacent to one another and similarly assigned complementary functions (e.g., scroll left, scroll right, etc.). The controls 114-120 may also be configured for selecting remote sensor units to be read by the handheld unit 102a. In another example, the display 110 and controls 112-120 may also be realized as areas of a touch screen 122 of the devices 102b-102n.

The system 100 may implement a wireless interface between the remote sensor units 104a-104n and the handheld (or display) units 102a-102n. The remote sensor units 104a-104n may be configured to transmit to any receiver compliant with the wireless protocol implemented by the sensor units. In one example, each remote sensor unit 104a-104n may have an individual MAC ID that may be used to identify the source of power readings and provide secure communications. In one example, the handheld units 102a-102n may be configured to maintain communications with multiple sensor units. For example, the controls on the handheld units 102a-102n may be used to switch between multiple remote sensor units.

In one example, the handheld units 102a-102n may be configured to scan and pair to any available remote sensor units 104a-104n. Pairing to the remote sensor units 104a-104n may be performed one sensor at a time. In one example, the handheld units 102a-102n may be configured to display only a predetermined number of nearer remote sensor units. The remote sensor units 104a-104n may incorporate, in one example, a GPS (global positioning system) puck to provide location and time reference information (e.g., useful in cloud monitoring). In one example, the handheld units 102a-102n may be configured to display readings in alphanumeric format. However, other formats (e.g., graphic, oscilloscope, etc.) may be implemented to meet the design criteria of a particular implementation.

In one example, the remote sensor units 104a-104n may be calibrated using a 50 MHz power reference. Each of the remote sensor units 104a-104n generally stores a respective calibration table in non-volatile memory (e.g., Flash, EEPROM, etc.). Each of the remote sensor units 104a-104n may be re-calibrated and the table updated as needed (e.g., yearly, after repair due to damage, etc.). A threshold may be implemented for each of the remote sensor units 104a-104n to monitor a condition (e.g., impedance) of an integrated RF (radio frequency) detector (e.g., diode). Each of the remote sensor units 104a-104n may be configured to recommend re-calibration based on the threshold.

The system 100 may have many applications, including but not limited to testing cellular infrastructure equipment and WLAN (wireless local area network) devices, and allowing for the easy installation and maintenance of business communication systems. For example, the remote sensor units 104a-104n may be connected to the communication systems in hard to reach areas (e.g., on a cell tower, in a closed cabinet, etc.). The readings may be taken remotely (e.g., on the ground, outside the cabinet, at a central location, etc.) from the remote sensors 104a-104n using one of the handheld units 102a-102n.

Figure 2:
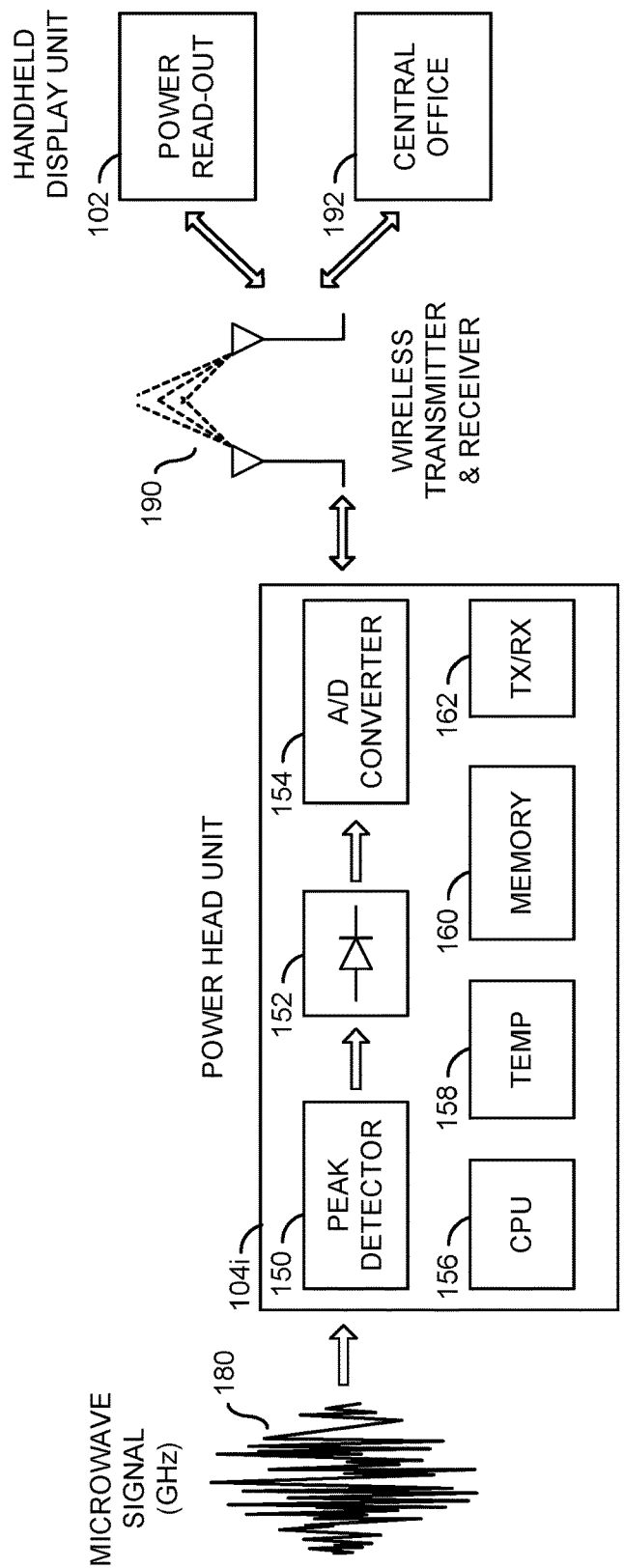
FIG. 2 is a diagram illustrating an example operation of a sensor in accordance with an embodiment of the invention.

Referring to FIG. 2, a diagram is shown illustrating an example operation of the system 100. In one example, a remote sensor unit 104i may comprise a block (or circuit) 150, a block (or circuit) 152, a block (or circuit) 154, a block (or circuit) 156, a block (or circuit) 158, a block (or circuit) 160, and a block (or circuit) 162. The block 150 may be implemented as a peak detector. The block 152 may be implemented as a diode device. The block 154 may be implemented as an analog-to-digital converter (ADC). The block 156 may be implemented as a processor. The block 158 may be implemented as a temperature module. The block 160 may be implemented as a memory. The block 162 may be implemented as a transceiver (TX/RX) module. In one example, the blocks 150-154 may be implemented as a first (analog) module and the blocks 156-162 may be implemented as a second (digital) module. The blocks 150-162 may be connected using conventional techniques.

In one example, a microwave or millimeter wave (GHz) signal 180 may be sent through the remote sensor unit 104i. The microwave signal 180 may initially be passed through the peak detector 150. An output of the peak detector 150 generally presents a signal representing the high frequency peak power (W) of the microwave signal 180. The output of the peak detector 150 may be presented to a first terminal (or input) of the diode device 152. A second terminal (or output) of the diode device 152 may present a signal to the analog-to-digital converter 154. The analog-to-digital converter 154 may convert the output of the diode device 152 to the digital domain so that the processor 156 may transmit information (e.g., power level, etc.) regarding the digitized microwave signal via a wireless link 190 to the handheld display unit 102, a central office 192 or some other device (e.g., cloud resources), where a user may read the information (e.g., power measurement, etc.). In an example, the handheld unit 102 may allow the user to take local readings to check remote readings (e.g., at the central office, cloud, etc.) for interference.

The processor 156 is generally configured (e.g., through software, firmware, microcode, hardwiring, etc.) to generate the information regarding the digitized microwave signal. In one example, the processor 156 may generate the information using, for example, data for temperature compensation from the temperature module 158 and conversion (or calibration) tables stored in the memory 160. The information regarding the digitized microwave signal may be transmitted via the wireless link 190 to the handheld unit 102 or central office (facility) 192 using the transceiver module 162. In one example, the memory 160 may be configured to store a three-dimensional lookup table containing calibration information for the particular remote sensor (or power head) unit 104i. The information (e.g, tables) in the memory 160 and/or software, firmware etc. of the processor 156 may be updated (programmed) via the wireless link 190.

Figure 3:
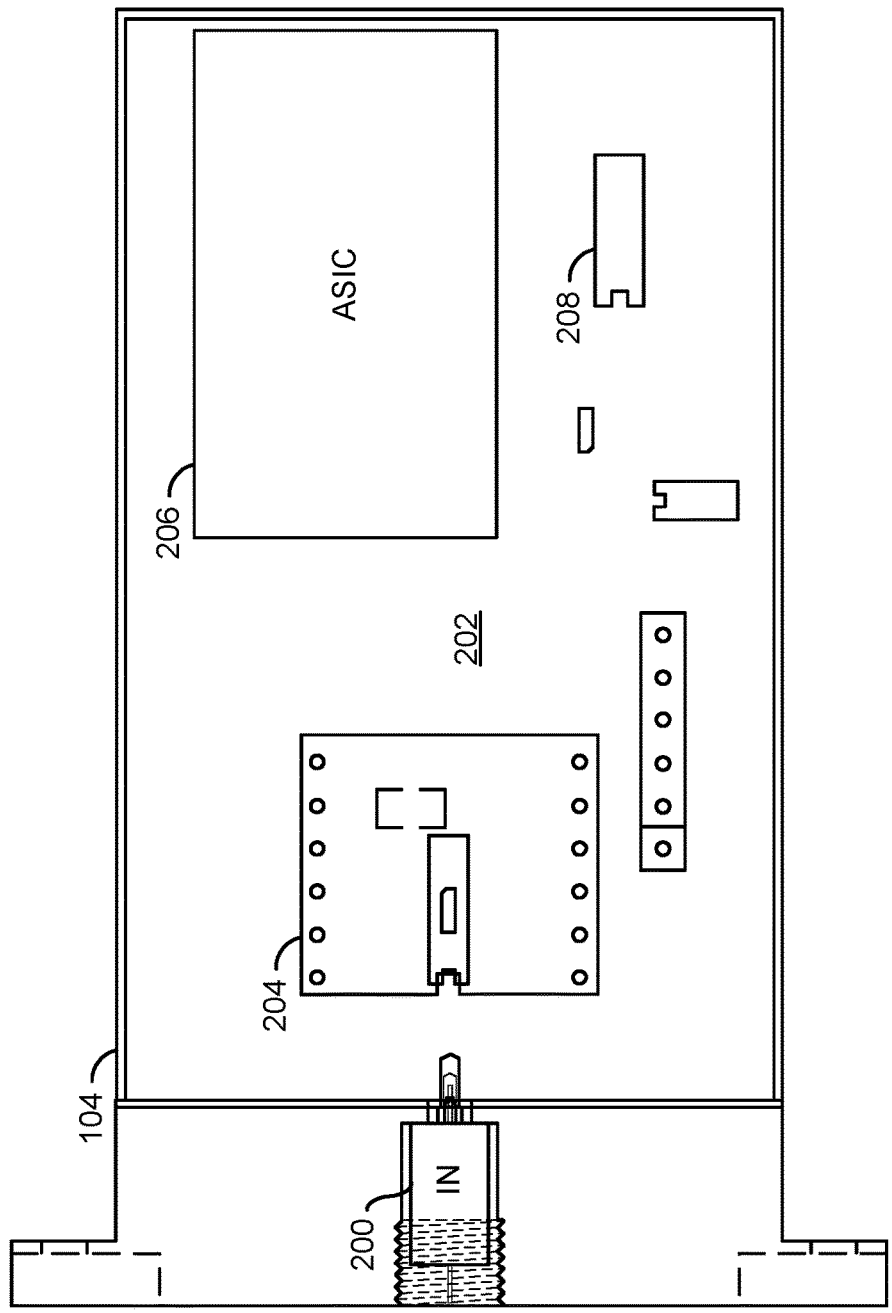
FIG. 3 is a diagram illustrating an example implementation of a sensor of FIG. 1.

Referring to FIG. 3, a diagram of remote sensor unit 104 is shown illustrating an example implementation of a remote sensor unit of FIG. 1. In one example, the remote sensor unit may comprise an RF detector module 200 and a signal processing module 202. An output of the RF detector module 200 may be connected to the signal processing module 202 using conventional techniques (e.g., soldering, a connector, surface mounting, etc.). The RF signal to be measured may be presented to the RF detector 200 through a connector attached to an input of the RF detector module 200.

In an example, the signal processing module 202 may comprise a block (or circuit) 204, a block (or circuit) 206, and a block (or circuit) 208. The circuit 204 may implement an amplifier (e.g., a video amplifier). In an example, the amplifier 204 may include auto ranging. The circuit 206 may be implemented, in an example, as an application specific integrated circuit (ASIC). In various embodiments, the circuit 206 may be implemented including an IEEE 802.15.4/ZigBee® planar inverted F antenna (PIFA) module. However, other signal processing and wireless transceiver modules may be implemented accordingly to meet the design criteria of a particular implementation. In one example, the circuit 206 may be implemented using an MD100A ZigBee® PIFA module available from Aveslink Technology, Inc. of San Jose, Calif. The circuit 208 may implement an extended memory for the circuit 206. The signal processing module 202 may also include a USB connector (not shown), which may be used to communicate with the circuit 206 and/or charge batteries associated with the remote sensor 104.

Figure 4:
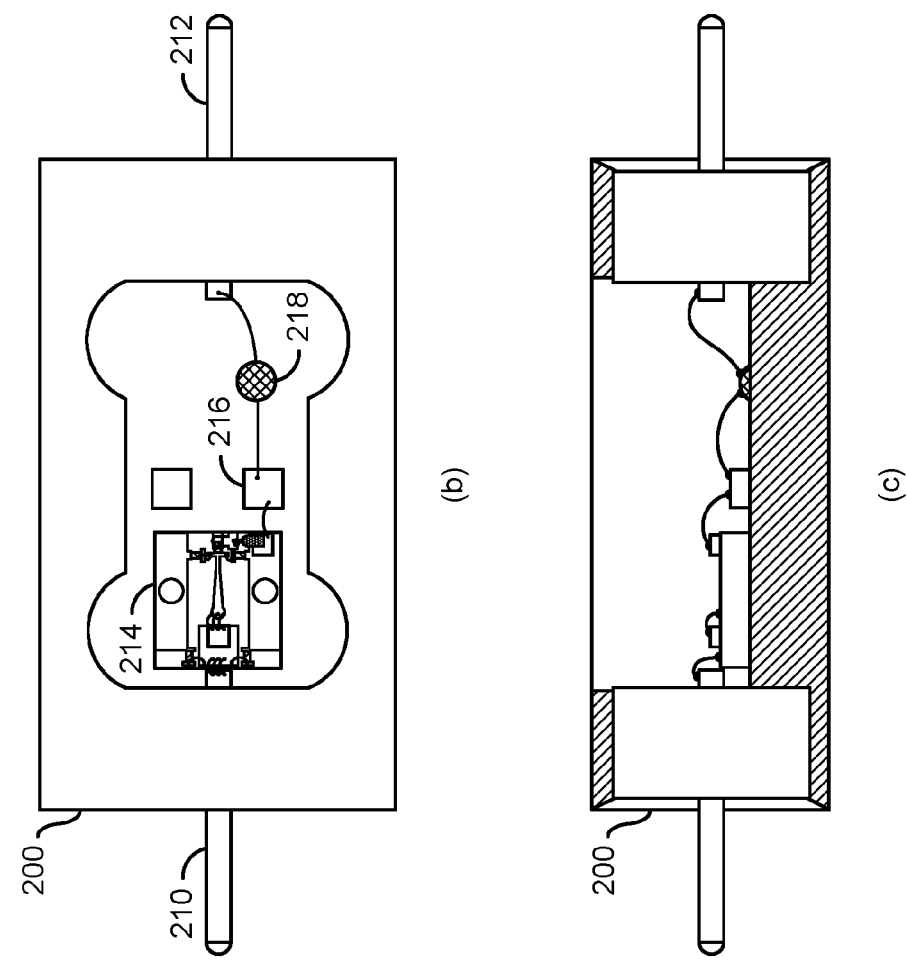
FIG. 4 is a diagram illustrating three views (a-c) of an example RF detector module of FIG. 3.

Referring to FIG. 4, a diagram is shown illustrating a circuit diagram (a), a top view (b), and a side view (c) of an example implementation of the RF detector module 200 of FIG. 3. In an example, a zero bias Schottky diode detector (e.g., part number EZM0126PM1 manufactured by Eclipse Microwave of San Jose, Calif.) may be used to implement the RF detector module 200. In an example, the RF detector module 200 may comprise an input pin (or lead) 210, an output pin (or lead) 212, a match attenuator 214, and a capacitor 216. The pin 210 may be connected to an input of the match attenuator 214 using, in one example, a gold mesh. An output of the match attenuator 214 may be connected to a first terminal of the capacitor 216 using, in one example, a 0.7 mil gold wire. A second terminal of the capacitor 216 may be connected to the output pin 212 using, in one example, a 0.7 mil gold wire. The wire between the second terminal of the capacitor 216 and the output pin 212 may be held in place using a non-conductive epoxy stake 218.

In one example, a detector circuit of RF detector module 200 may comprise a first resistor (R1), a second resistor (R2), a third resistor (R3), a first capacitor (C1), a second capacitor (C2), and the zero bias Schottky diode (D1). The components may be implemented as part of the match attenuator 214. In another example, an optional second diode (D2) and third capacitor (C3) may also be implemented. In an example, an anode of the diode D2 may be connected to a cathode of the diode D1.

Figure 5:
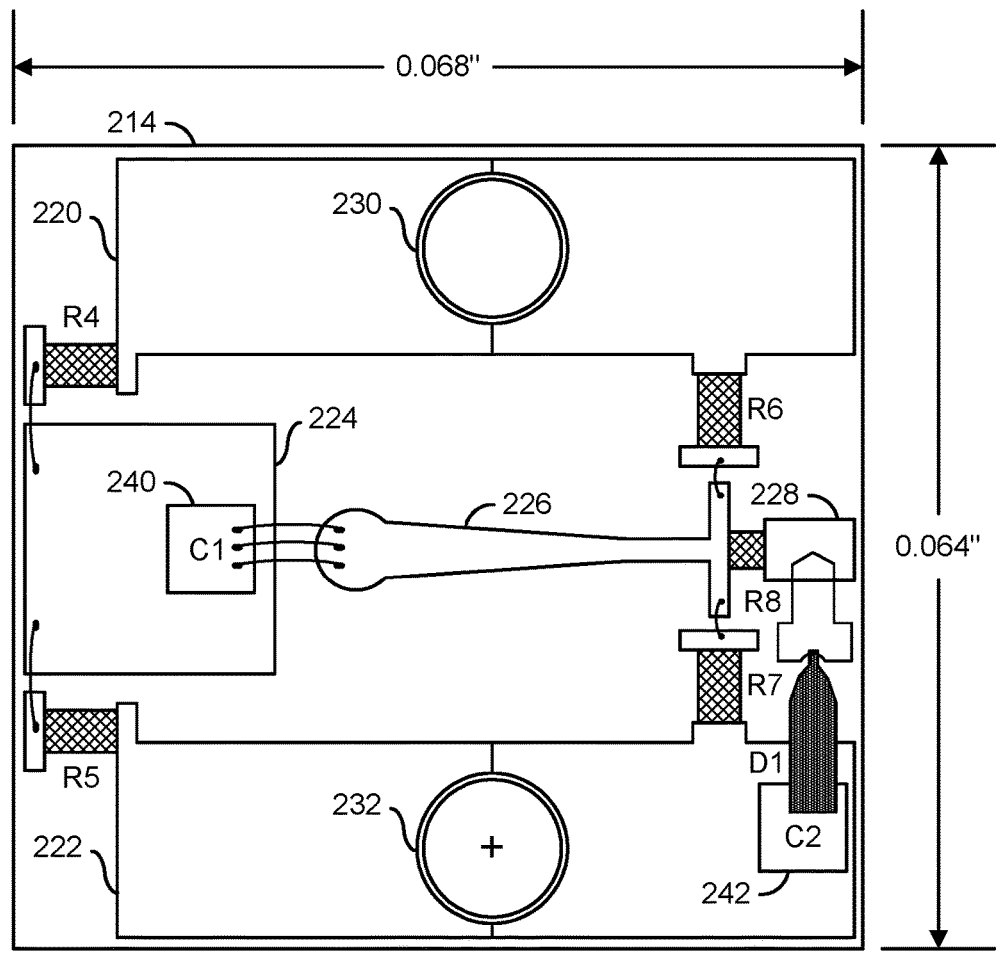
FIG. 5 is a diagram illustrating an example substrate attenuator and associated components of FIG. 4.

Referring to FIG. 5, a diagram of the match attenuator 214 of FIG. 4 is shown illustrating an example implementation. In one example, the match attenuator 214 may comprise a substrate attenuator and associated components implementing the detector circuit of FIG. 4. In one example, the substrate attenuator may be implemented comprising a first metal portion 220, a second metal portion 222, a third metal portion 224, a fourth metal portion 226, and a fifth metal portion 228. The metal portions 220 and 222 may be connect to a second substrate (e.g., a ground plane) using plated-through vias 230 and 232, respectively. The metal portion 224 may be connected to the metal portion 220 (e.g., through a resistor R4 and a 0.7 mil gold wire). The metal portion 224 may also be connected to the metal portion 222 (e.g., through a resistor R5 and a 0.7 mil gold wire). The metal portion 224 may be further connected to the metal portion 226 (e.g., through a capacitor 240 and a gold wire mesh). The metal portion 226 may also be connected to (i) the metal portion 220 (e.g., through a resistor R6 and a 0.7 mil gold wire), (ii) the metal portion 222 (e.g., through a resistor R7 and a 0.7 mil gold wire), and (iii) the metal portion 228 (e.g., through a resistor R8). The metal portion 228 may be connected to the metal portion 222 (e.g., through a diode D1 and a capacitor 242).

In one example, the capacitor 240 may be implemented as a 100 pf surface mount capacitor. In one example, the capacitor 242 may be implemented as a 470 pf surface mount capacitor. The resistors R4, R5, R6, and R7 may be implemented, in one example, as 100 ohm, 5% tolerance surface mount resistors. The resistor R8 may be implemented, in one example, as a 50 ohm, 5% tolerance surface mount resistor. The resistors R4 and R5 generally correspond with the resistor R1 of FIG. 4. The resistors R6 and R7 generally correspond to the resistor R2 of FIG. 4. The resistor R8 generally corresponds to the resistor R3 of FIG. 4. The capacitors 240 and 242 generally correspond to the capacitors C1 and C2, respectively, of FIG. 4. In one example, the substrate attenuator may be formed on a 0.015 inch thick polished alumina substrate comprising 99.6% $Al_2O_3$. In one example, the substrate attenuator may have a finish of 250±50 angstroms TiW and 100UIN type Gold on both sides.

Figure 6:
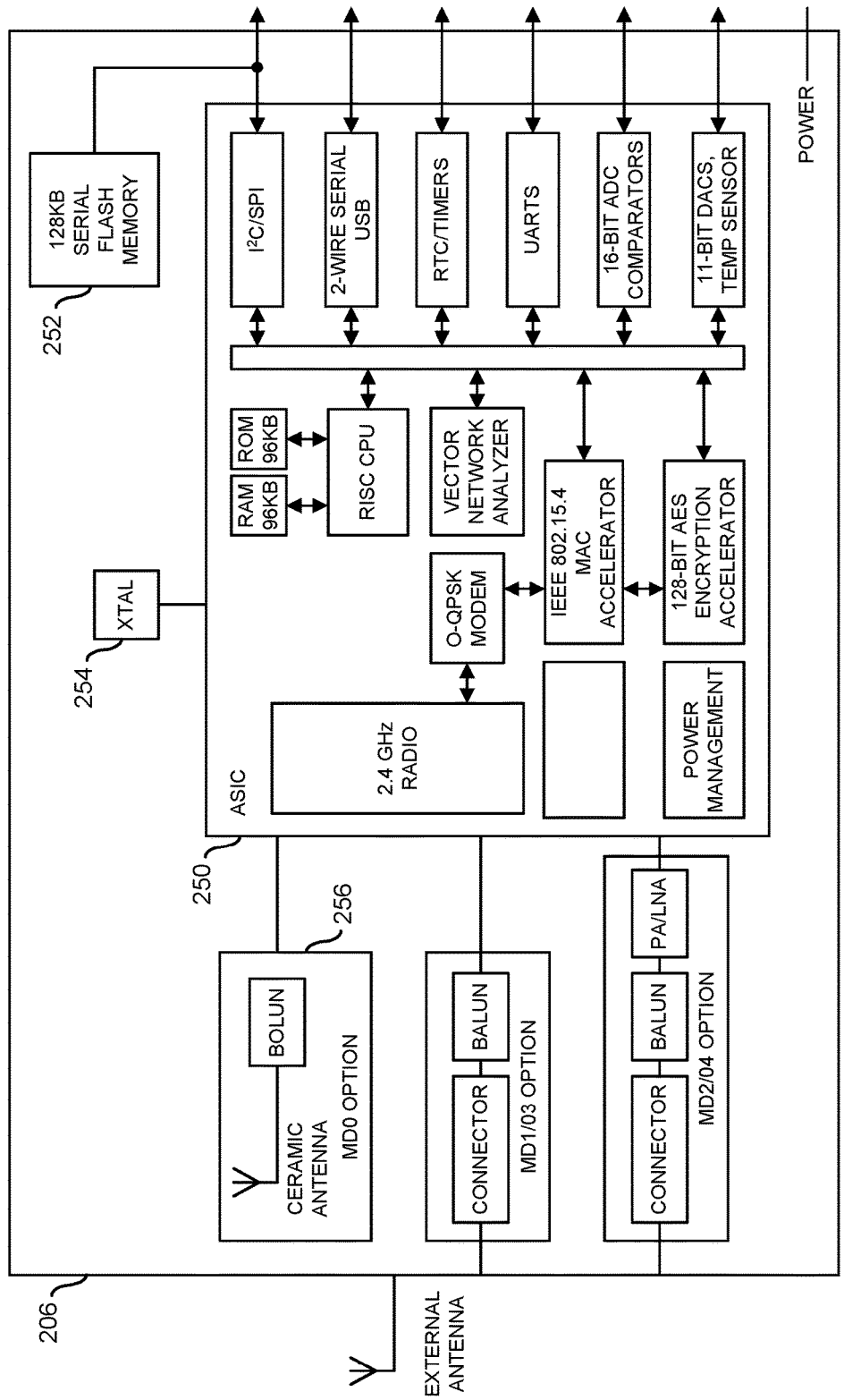
FIG. 6 is a diagram illustrating an example implementation of a application specific integrated circuit of FIG. 3.

Referring to FIG. 6, a diagram is shown illustrating an example implementation of the module 206 of FIG. 3. In one example, the module 206 may comprise a circuit (or module) 250 and a circuit (or module) 252. The circuit 250 may be implemented, in one example, as a processing module. In one example, the circuit 250 may be implemented using a JN5139 chip available from Aveslink Technology, Inc. of San Jose, Calif. The circuit 252 may be implemented, in one example, as a serial flash memory. The module 250 may also include a crystal 254 and PIFA module 256. Optionally, the PIFA module 256 may be replaced with an interface to an external antenna. In one example, the optional interface may comprise a connector and a balun. In another example, the interface may also include a power amplifier (PA) and/or low noise amplifier (LNA).

In one example, the circuit 250 may comprise a processor (e.g., a RISC CPU), memory (e.g., random access memory (RAM), read only memory (ROM), etc.), a radio transceiver (e.g., 2.4 GHz), a modem (e.g., O-QPSK, etc.), an IEEE 802.15.4 MAC accelerator, an encryption accelerator (e.g., 128-bit AES, etc.), a serial peripheral interface (SPI), a vector network analyzer, and a 2-wire serial interface (e.g., USB). The circuit 250 may also comprise one or more timers, one or more universal asynchronous receiver transmitters (UARTs), one or more 12-bit analog-to-digital converters (ADCs) and comparators, one or more 11-bit digital-to-analog converters (DACs), and a temperature sensor. The components of the circuit 250 may be connected by one or more busses. The circuit 250 may also comprise power management circuitry.

Figure 7:
FIG. 7 is a diagram illustrating another example implementation of a sensor module of FIG. 1.

Referring to FIG. 7, a diagram is shown illustrating another example implementation of a sensor module of FIG. 1. In one example, the sensor module 104 may comprise a circuit (or module) 260. In an example, the circuit 260 may be implement on a double sided printed circuit board (PCB). In an example embodiment, the circuit 260 may comprise a circuit (or module) 261, a circuit (or module) 263, a circuit (or module) 265, a USB connector 267, and a power indicator (e.g., a light emitting diode) 269. The circuit 251 may be implemented, in one example, as a microprocessor or microcontroller chip. The circuit 263 may be implemented, in one example, with an IEEE 802.15.4/ZigBee® planar inverted F antenna (PIFA) module. In another example, the circuit 263 may be implemented using an MD100A ZigBee PIFA module available from Aveslink Technology, Inc. of San Jose, Calif. However, other signal processing and wireless transceiver modules may be implemented accordingly to meet the design criteria of a particular implementation.

The circuit 265 may implement a removable media socket. In an example, the circuit 265 may be configured to allow the circuit 260 to use a removable memory card (e.g., a micro SD card, etc.) as extended memory. The USB connector 267 may be used to communicate with the circuit 260 and/or charge batteries associated with the remote sensor 104. The indicator 269 may be configured to provide a visual indication whether the remote sensor module 104 is turned on, turned off, charged, and/or charging.

Figure 8:
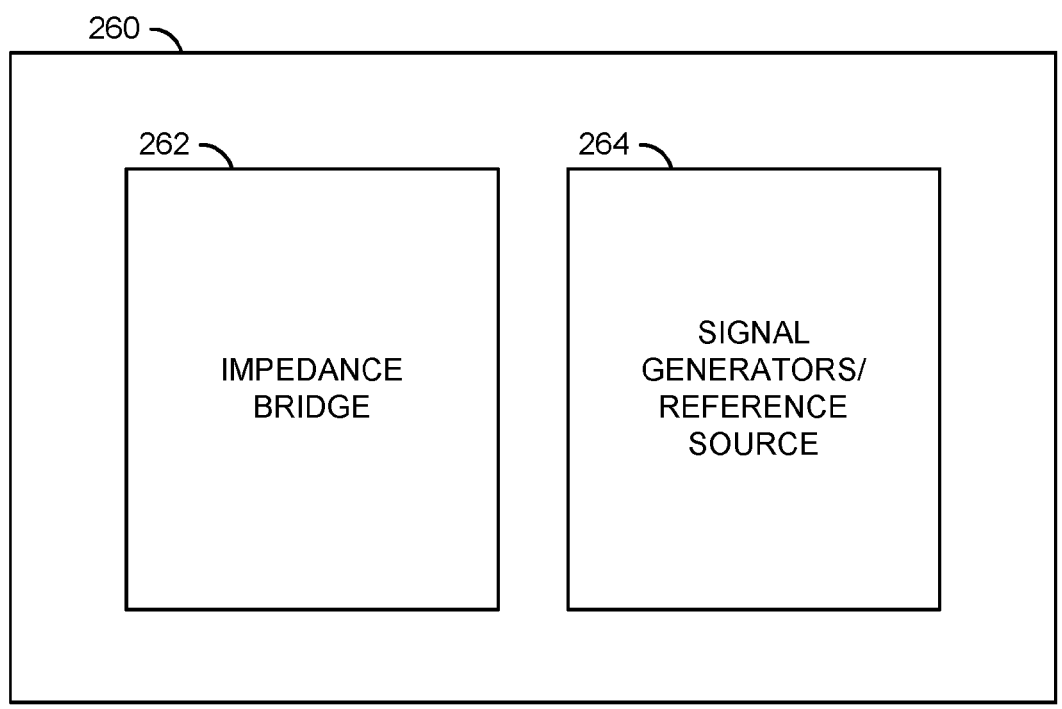
FIG. 8 is a diagram illustrating a bottom surface of a printed circuit board of FIG. 7.

Referring to FIG. 8, a diagram is shown illustrating an example implementation of a bottom surface of the circuit board 260 of FIG. 7. In an example, the bottom surface of the circuit board 260 may provide connections for a block (or circuit) 262 and a block (or circuit) 264. The circuit 262 may implement an impedance bridge. The circuit 264 may implement a signal generator and/or reference source. In an example, the circuit 264 may implement a 50 MHz 1 milliwatt calibrated reference source.

The circuit 264 may be used to determine whether the power sensor module 104 is still operating within a desired accuracy. When power sensors are calibrated, the calibration is performed against a particular reference source. The check is not of the diode itself, but instead makes sure the diode is detecting the correct power level. The industry typically calibrates to a 1 milliwatt, 50 MHz source provided by the National Bureau of Standards. In an example, the circuit 264 may be configured (calibrated) to generate a 50 MHz, 1 milliwatt signal similar to the National Bureau of Standards signal. The signal generated by the circuit 264 may be utilized to check for drift in the power measurements performed by the circuit 260 using the diode detector 200. The circuit 264 may be calibrated prior to the sensor 104 being placed out in the field.

Figure 9:
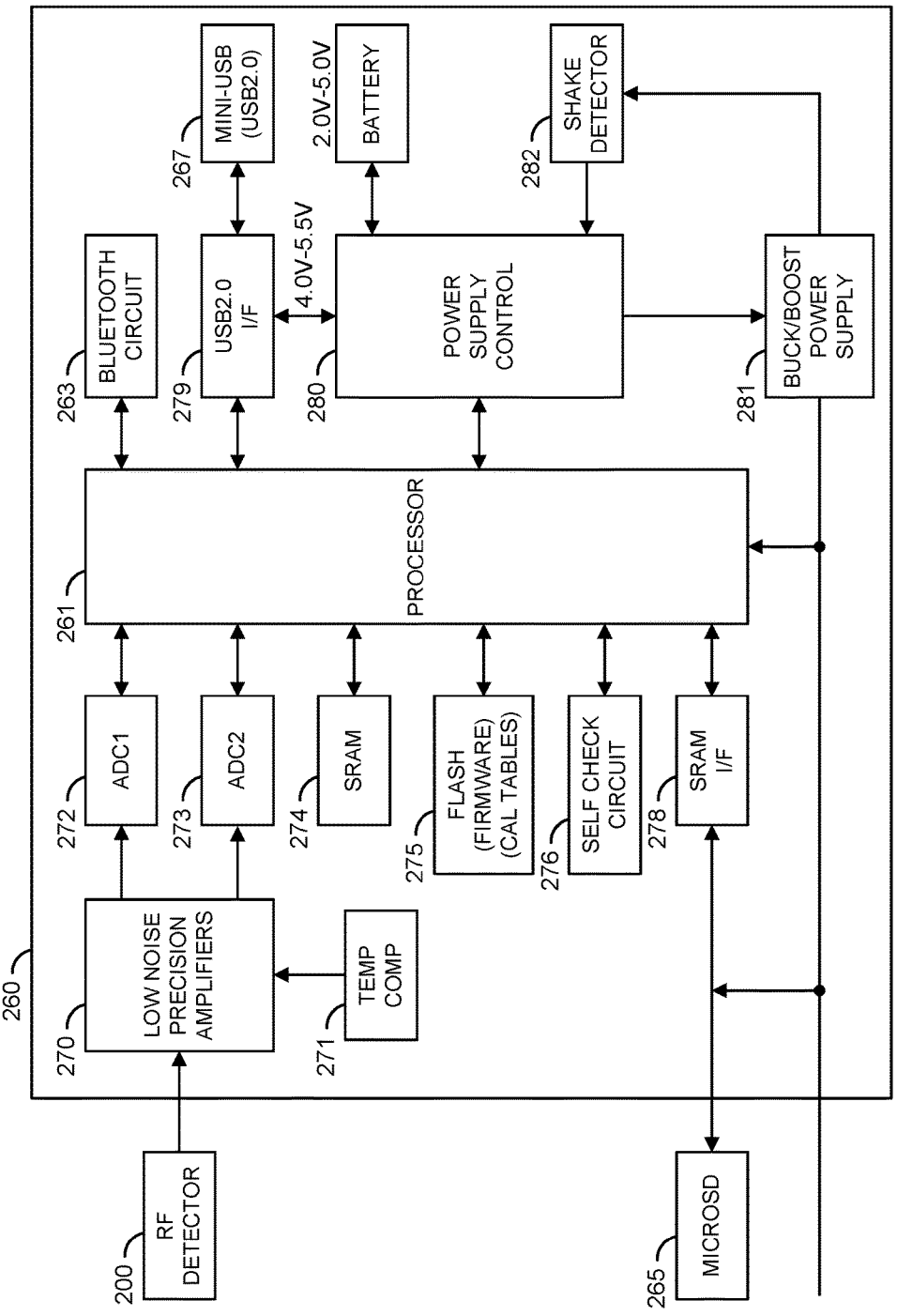
FIG. 9 is a diagram illustrating an example implementation of the sensor module of FIG. 7 in accordance with an embodiment of the invention.

Referring to FIG. 9, a diagram is shown illustrating an example implementation of the sensor module of FIG. 7 in accordance with an embodiment of the invention. In an example, the circuit (or module) 260 may comprise a block (or circuit) 261, a block (or circuit) 263, a block (or circuit) 270, a block (or circuit) 271, a block (or circuit) 272, a block (or circuit) 273, a block (or circuit) 274, a block (or circuit) 275, a block (or circuit) 276, a block (or circuit) 278, a block (or circuit) 279, a block (or circuit) 280, a block (or circuit) 281, and a block (or circuit) 282. An input of the circuit 260 may be coupled to an output of the RF detector 200. The circuit 260 also may be connected to the removable media socket 265. The removable media socket 265 may allow the circuit 260 to use a removable memory card (e.g., micro SD, etc.) as an extended memory.

The circuit 261 may be implemented as a processor. The circuit 263 may be implemented as a Bluetooth circuit. In one example, the circuit 263 may be implemented using an MD100A ZigBee® PIFA module available from Aveslink Technology, Inc. of San Jose, Calif. However, other signal processing and wireless transceiver modules may be implemented accordingly to meet the design criteria of a particular implementation. The circuit 270 may be implemented as one or more low noise precision amplifiers. The output of the RF detector 200 is generally presented to an input of the circuit 270. The circuit 271 may implement a temperature compensation circuit. In an example, the circuit 271 may be configured to provide temperature compensation for the low noise amplifiers (LNAs) of the circuit 270.

The circuits 272 and 273 may be implemented as analog-to-digital converter (ADC) circuits. The circuit 274 may implement a solid state random access memory (e.g., SRAM). The circuit 275 may implement a nonvolatile memory (e.g., Flash, etc.). The circuit 275 may be configured to store firmware (e.g., instruction code executed by and controlling operation of the processor 261) and/or calibration tables. The circuit 276 may implement a self check circuit. The circuit 278 may implement a serial memory interface circuit. The circuit 278 may be configured to connect the removable media slot 265 to the processor 261. The circuit 278 also may be configured to provide power to the removable media slot 265.

The circuit 279 may implement a universal serial bus (e.g., USB 2.0, etc.) interface circuit. The circuit 279 may connect signals to and from the processor 261 from and to the USB connector 267. The circuit 280 may implement a power supply control circuit. The power supply control circuit 280 may provide power supplied by a rechargeable battery to various modules of the sensor unit 104. The circuit 280 may also be configured to charge the battery when an external power supply is available (e.g., via the USB connector). The circuit 281 may implement a buck/boost power supply circuit. The circuit 282 may implement a shake detector. The various blocks in the circuit 260 may be connected together by various traces, buses and/or protocols.

Figure 10:
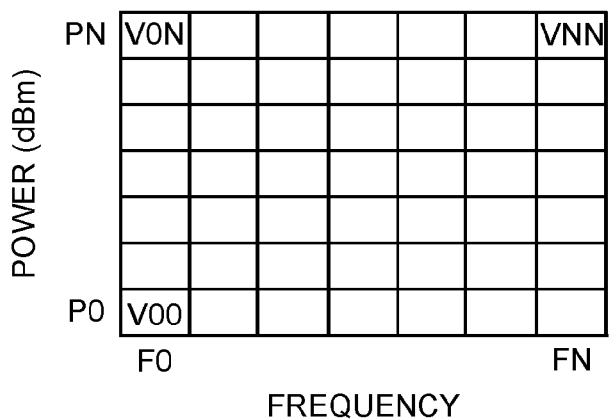
FIG. 10 is a diagram illustrating an example look up table in accordance with an embodiment of the invention.

Referring to FIG. 10, a diagram of a table 290 is shown illustrating an example power lookup table (LUT) in accordance with an embodiment of the present invention. In one example, the table 290 may comprise a number of frequency data points F0, . . . , FN, a number of voltage data points V0, . . . , VN for each frequency F0, . . . , FN, and a number of power data points P0, . . . , PN for each frequency F0, . . . , FN. The table 290 may be configured to relate a voltage reading to a respective power reading for every frequency Fi. The size of the table 290 is generally only limited by the amount of memory (e.g., Flash, etc.) available.

Figure 11:
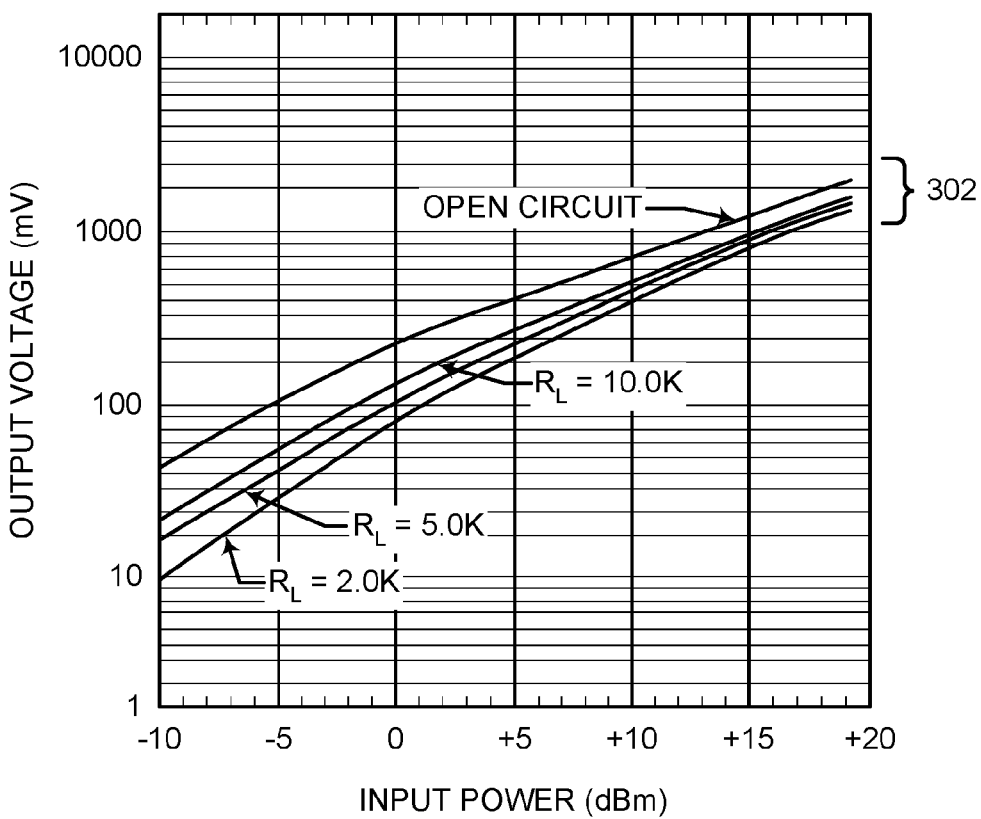
FIG. 11 is a graph illustrating example power transfer curves for the RF detector of FIG. 4.

Referring to FIG. 11, a graph 300 is shown illustrating example power transfer curves 302. In an example, the processor 156 of FIG. 2 may be configured to generate additional data values using the table stored in the remote sensor unit. For example, if a measurement from the ADC 154 falls between two frequency data points, the processor 156 may be configured to determined the correct frequency using, for example, straight-line interpolation or extrapolation. Similarly, if a voltage measurement falls between two points in the power table, the processor may be configured to take a slope of a corresponding one of the power transfer curves 302 to calculate the correct power measurement. Thus, the processor 156 may create a pseudo table for in-between frequencies based on the table stored in the remote sensor unit (e.g., in the memory 160). The power transfer curves 302 for the diode device are generally very predictable, so a lot of points are not necessary. In one example, 40 points may be used to calibrate the remote sensor unit 104i (e.g., 1 dB steps from −30 to +10 dBm). In one example, the points may be calculated using one of the curves 302 and the following equations:

$$P2-P1=10 \log [V2/V1], \text{below } -17 \text{ dBm};$$

and 18 log to 20 log above −17 dBm.

Figure 12:
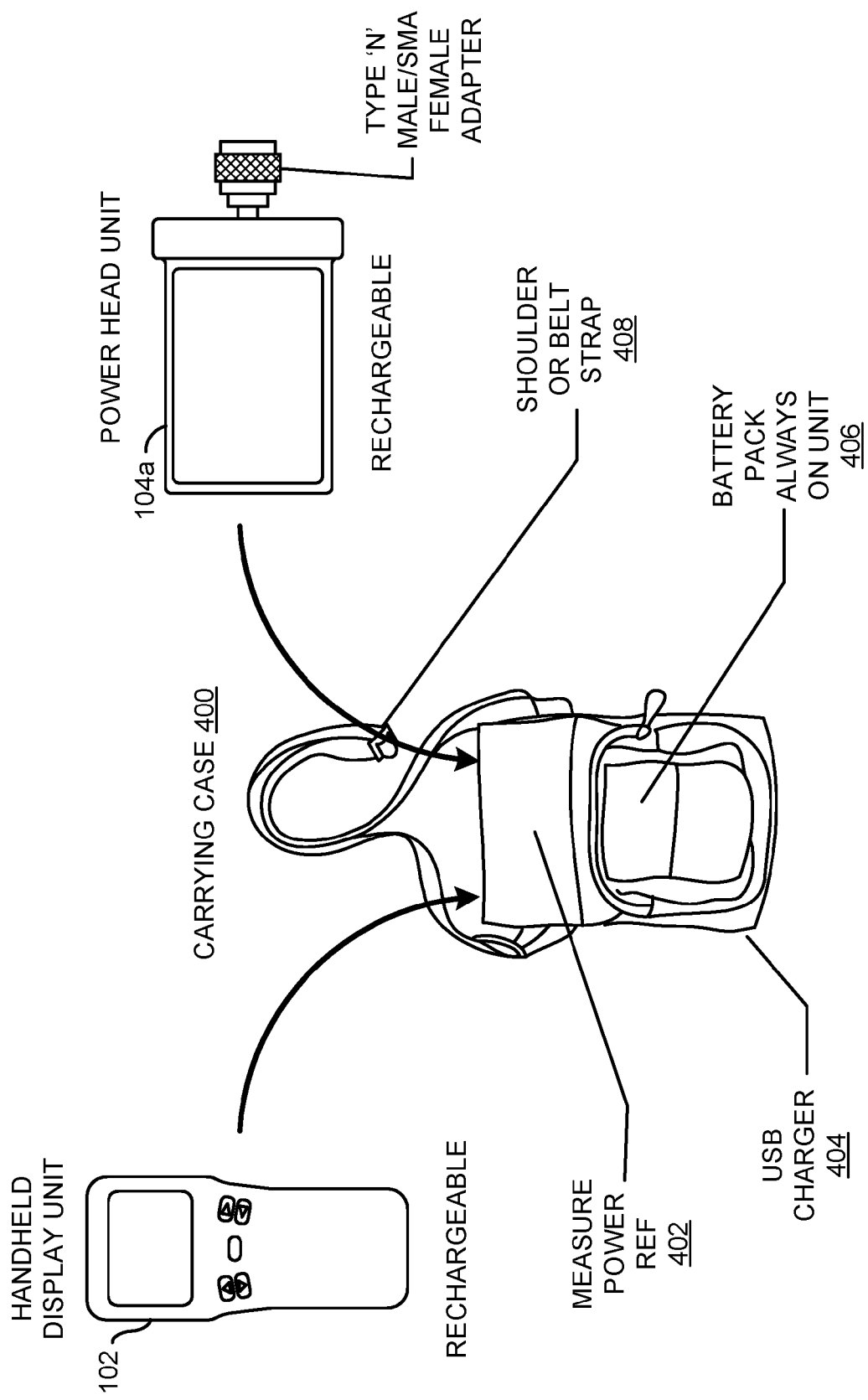
FIG. 12 is a diagram illustrating a carrying case for components of a system in accordance with an embodiment of the invention.

Referring to FIG. 12, a diagram is shown illustrating various components of a power meter system in accordance with an example embodiment of the present invention. In one example, a carrying case 400 may be configured to house the system 100 when the system 100 is not in use. In one example, the carrying case may provide space for the handheld unit 102, a number of remote sensor units 104a-104n, a power reference 402 for calibrating the remote sensor units 104a-104n, a USB charger 404, and a battery pack 406. The handheld unit 102 and the remote sensor units 104a-104n may be implemented with rechargeable batteries. The rechargeable batteries of the handheld unit 102 and the remote sensor units 104a-104n may be maintained in a charged condition using the USB charger 404 and/or the battery pack 406 in the carrying case 400. In one example, the internal battery pack 406 may be implemented as a 6-hour USB rechargeable battery, keeping both batteries of each separate unit constantly charged. The carrying case 400 may also include a shoulder or belt strap 408 for ease of carrying.

Figure 13:
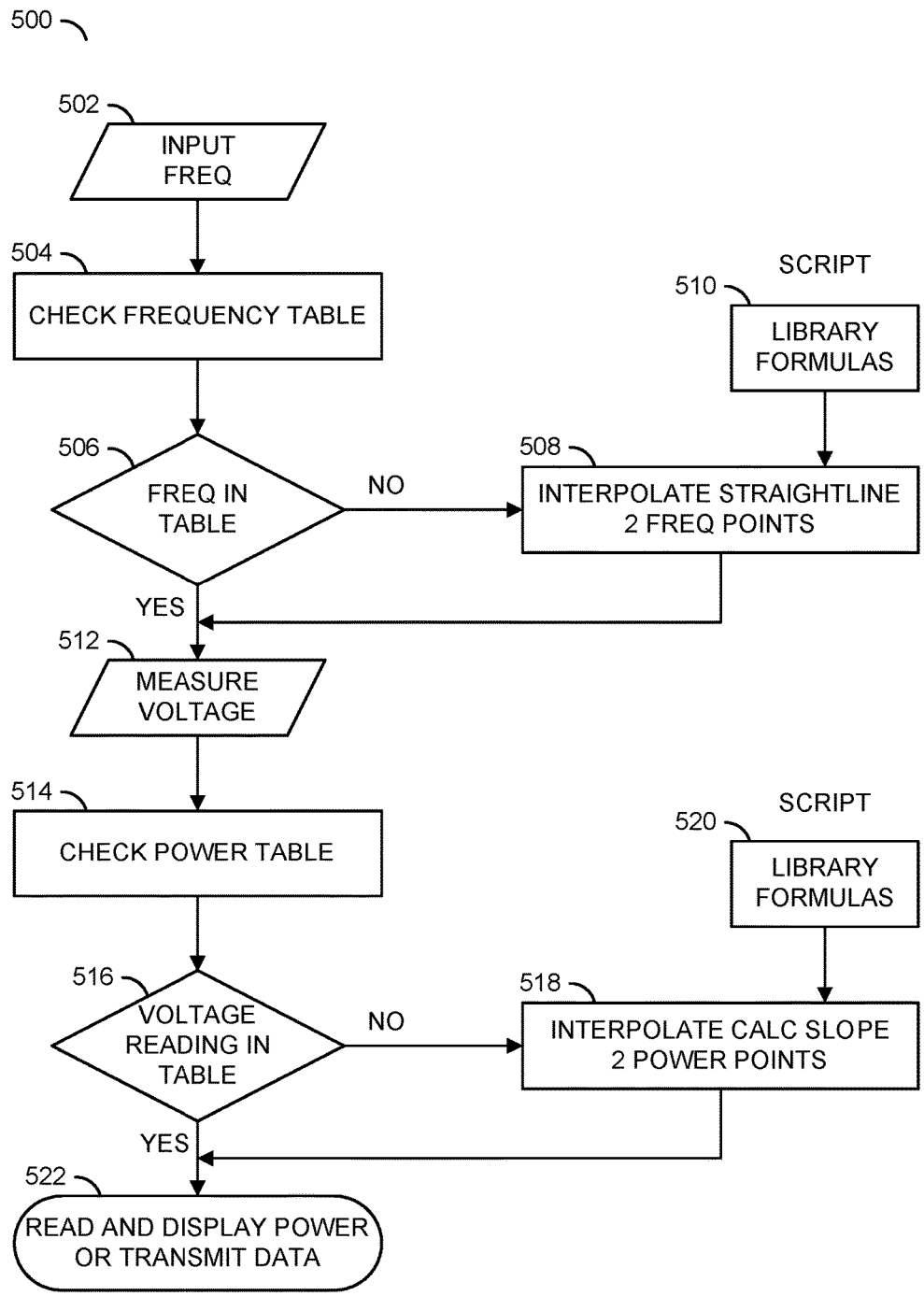
FIG. 13 is a flow diagram illustrating an example process in accordance with an embodiment of the invention.

Referring to FIG. 13, a flow diagram is shown illustrating a power reading process 500 in accordance with another example embodiment of the present invention. In one example, the process (or method) 500 may comprise a step (or state) 502, a step (or state) 504, a step (or state) 506, a step (or state) 508, a step (or state) 510, a step (or state) 512, a step (or state) 514, a step (or state) 516, a step (or state) 518, a step (or state) 520, and a step (or state) 522. In the step 502, a frequency at which the measurement is being made may be input. In one example, the particular frequency may be entered by the user. For example, the handheld unit may implement a user interface that allows the user to scroll through and select frequencies at which measurements are made.

When the frequency has been input, the process 500 may move to the step 504 where a frequency table is checked for the frequency that was input. The process 500 then moves to the step 506. In the step 506, a determination is made whether the frequency that was input in the step 502 is in the table checked in the step 504. When the frequency is not in the table, the process 500 moves to the step 508 and generates a frequency data point using two known frequency data points and library formulas 510. In one example, the process 500 may generate the new data point through straight-line interpolation or extrapolation. When the new frequency data has been generated or the frequency that was input in the step 502 is in the table, the process 500 moves to the step 512.

In the step 512, the process 500 may measure the voltage representing the microwave power level (e.g., reading the output of the ADC 154). When the voltage level has been measured, the process 500 may move to the step 514, where a power table is checked for the voltage that was measured. The process 500 then moves to the step 516. In the step 516, a determination is made whether the voltage that was measured in the step 512 is in the power table checked in the step 514. When the voltage is not in the power table, the process 500 moves to the step 518 and generates a power data point using two known power data points and library formulas 520. In one example, the process 500 may generate the new power data point through straight-line interpolation or extrapolation. When the new power data point has been generated or the voltage that was measured in the step 512 is in the power table, the process 500 moves to the step 522. In the step 522, the power is read and displayed or transmitted.

Figure 14:
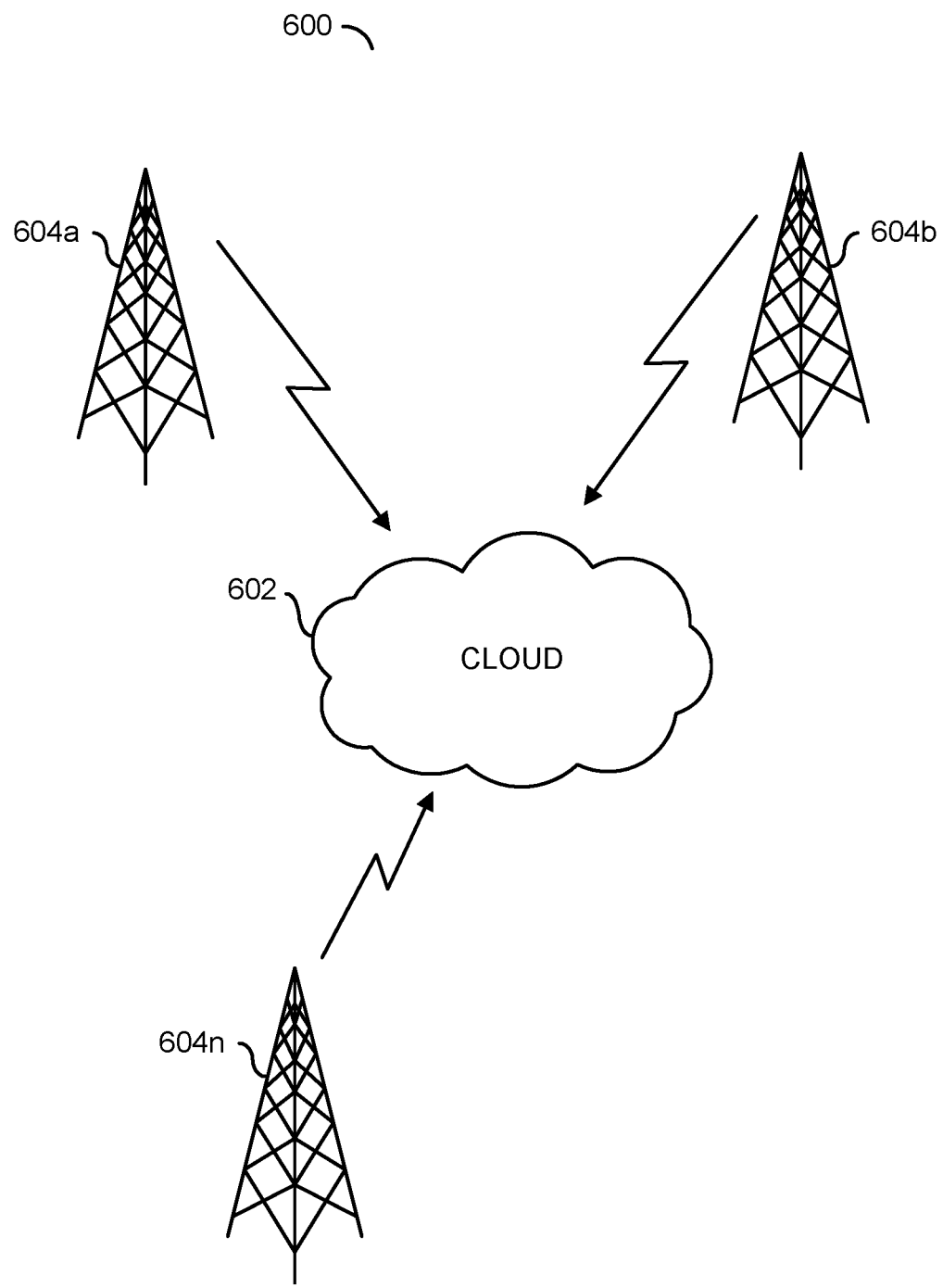
FIG. 14 is a diagram illustrating a remote power sensing system in accordance with an example embodiment of the invention.

Referring to FIG. 14, a diagram is shown illustrating a remote power sensing system in accordance with an example embodiment of the invention. In various embodiments, a system 600 may comprise a number of resources implemented in the form of a computing cloud 602 and a number of remote locations 604a-604n. Remote power sensing may be performed at the remote location 604a-604n by connecting sensor modules 104 to devices located at the remote locations (e.g., base stations, relay stations, hubs, nodes, etc.). The sensor modules at the location 604a-604n may wirelessly transmit measurements to cloud resources 602. In an example, a central office or monitoring station (not shown) may monitor the remote locations 604a-604n through the cloud based infrastructure. The system 600 generally provides the ability for devices connected to the cloud 602 to measure power levels at each of the locations 604a-604n without having to send a technician out to those remote locations. The measurements may be made numerous times in a day while minimizing the amount of overhead needed to maintain the distribution system.

Figure 15:
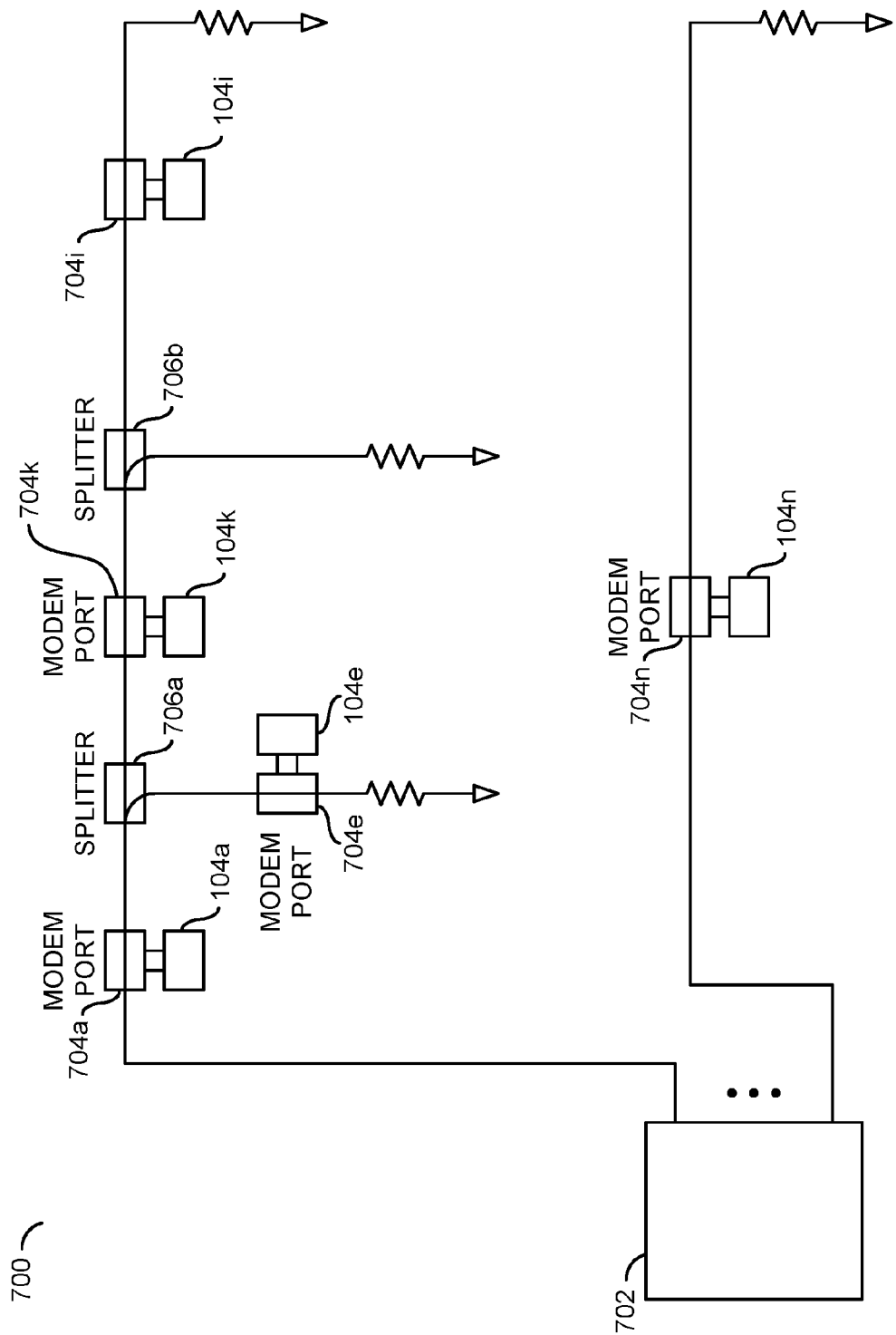
FIG. 15 is a diagram illustrating a CATV distribution system in accordance with an example embodiment of the invention.

Referring to FIG. 15, a diagram is shown illustrating a CATV (or other RF) distribution system 700 in accordance with an embodiment of the present invention. In various embodiments, the distribution system 700 may be implemented in a community, in a building (e.g., different floors), in a plane, from one end to another end of a train, etc. The system 700 may comprise a signal (power) source 702 and a number of ports 704a-704n. The ports 704a-704n may be distributed across multiple legs (or branches) of the system 700. The branches may be formed by a number of splitters 706a-706n. Signals may be measured at the various ports 704a-704n in the system 700 using a plurality of sensor modules 104a-104n. In an example, power levels at each port 704a-704n may be measured and loss(es) from one port to another or from the source 702 to any port 704a-704n may be determined remotely.

The functions illustrated by the diagram of FIG. 13 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. A remote radio frequency power sensing unit comprising:
   a first module configured to generate an analog signal representative of a power level of a radio frequency (RF) signal; and
   a second module configured to (i) receive a particular frequency of a plurality of frequencies over a wireless communication channel from a device, (ii) generate a value conveying a magnitude of said power level of said RF signal in response to said analog signal, (iii) convert said value into a digital signal communicating said power level based on said particular frequency indexed into a table, and (iv) transmit said digital signal communicating said power level and information identifying said radio frequency power sensing unit over said wireless communication channel to said device.

2. The remote radio frequency power sensing unit according to claim 1, wherein (i) said remote radio frequency power sensing unit is part of a power monitoring system and (ii) said particular frequency is selected based on an operating frequency of a communication system being monitored.

3. The remote radio frequency power sensing unit according to claim 1, wherein said remote radio frequency power sensing unit is configured to update said table when connected to a calibration module configured to calibrate said remote radio frequency power sensing unit using a radio frequency power reference.

4. The remote radio frequency power sensing unit according to claim 1, wherein said second module is further configured to interpolate a data point in said table that corresponds to said particular frequency when said particular frequency falls between a plurality of indices of said table.

5. The remote radio frequency power sensing unit according to claim 4, wherein said data point is interpolated from at least two other data points in said table corresponding to at least two of said indices above and below said particular frequency.

6. The remote radio frequency power sensing unit according to claim 1, wherein said second module is further configured to measure one or more of impedance and insertion loss.

7. The remote radio frequency power sensing unit according to claim 1, wherein said second module is further configured with a programmable sampling period.

8. The remote radio frequency power sensing unit according to claim 1, wherein said second module is programmable using text based commands.

9. A method of making remote radio frequency power measurements comprising:
   receiving a first value over a wireless communication channel from a device, said value representing an operating frequency of a communication system being monitored;
   generating an analog signal representative of a power level of a RF signal at a particular point in said communication system using a detector circuit;
   digitizing said analog signal to generate a second value that conveys a magnitude of said power level of said RF signal;
   converting said value into a digital signal communicating said power level based on said operating frequency indexed into a table; and
   transmitting said digital signal communicating said power level over said wireless communication channel to said device.

10. The method according to claim 9, wherein (i) said detector circuit is part of a power monitoring system and (ii) said operating frequency is selected by a user of said device.

11. The method according to claim 9, further comprising: updating said table with a calibration module using a mori circuit for diode characterization.

12. The method according to claim 9, further comprising: uniquely identifying said circuit to said device.

13. The method according to claim 9, further comprising: interpolating a data point in said table that corresponds to said operating frequency if said operating frequency falls between a plurality of indices of said table.

14. The method according to claim 13, wherein said data point is interpolated from at least two other data points in said table corresponding to at least two of said indices above and below said operating frequency.

15. The method according to claim 9, further comprising:
receive said digital signal communicating said power level at said device over said wireless communication channel; and
displaying said power level of said RF signal to a user of said device.

16. The method according to claim 9, wherein said table compensates for a temperature of said circuit.

17. A power monitoring system comprising:
at least one remote radio frequency power sensing unit configured to (i) generate an analog signal representative of a power level of a radio frequency (RF) signal, (ii) receive a particular frequency of a plurality of frequencies over a wireless communication channel, (iii) digitize said analog signal to generate a value that conveys a magnitude of said power level of said RF signal, (iv) convert said value into a digital signal communicating said power level based on said particular frequency indexed into a table and (v) transmit said digital signal communicating said power level over said wireless communication channel; and
a handheld reader configured to (i) transmit said particular frequency to said at least one remote radio frequency power sensing unit over said wireless communication channel, (ii) receive said digital signal communicating said power level over said wireless communication channel and (iii) display said power level of said RF signal in a user-understandable format.

18. The power monitoring system according to claim 17, wherein said at least one remote radio frequency power sensing unit is further configured to interpolate a data point in said table that corresponds to said particular frequency if said particular frequency falls between a plurality of indices of said table.

19. The power monitoring system according to claim 17, wherein said handheld reader is further configured to monitor a plurality of said remote radio frequency power sensing units.

20. The power monitoring system according to claim 17, wherein said handheld reader is implemented as software on a personal computing device compliant with a wireless protocol of said wireless communication channel and selected from a group comprising (i) a cellular telephone, (ii) a smart phone, (iii) a tablet, (iv) a personal digital assistant, and (v) a computer-based device.

* * * * *